United States Patent [19]

Yoshida et al.

[11] Patent Number: 4,826,752
[45] Date of Patent: May 2, 1989

[54] DRY PHOTOSENSITIVE LITHOGRAPHIC PLATE COMPRISING A SILICON RUBBER LAYER CONTAINING AN AROMATIC AMINOSILANE

[75] Inventors: Susumu Yoshida; Hiroshi Takahashi, both of Shizuoka; Hisashi Aoki; Kiyohiro Kondow, both of Annaka; Tetsuya Mayuzumi, Kawagoe, all of Japan

[73] Assignee: Fuji Photo Film Co., Ltd., Minami-Ashigara, Japan

[21] Appl. No.: 63,470

[22] Filed: Jun. 18, 1987

[30] Foreign Application Priority Data

Jun. 25, 1986 [JP] Japan .................................. 61-149088

[51] Int. Cl.[4] .......................... G03C 1/52; G03F 7/02; G03F 7/10
[52] U.S. Cl. .................................... 430/155; 430/160; 430/162; 430/166; 430/167; 430/272; 430/303
[58] Field of Search ............... 430/155, 160, 162, 166, 430/167, 272, 303

[56] References Cited

U.S. PATENT DOCUMENTS

| | | | |
|---|---|---|---|
| 3,945,830 | 3/1976 | Yazawa et al. | 430/167 |
| 3,953,212 | 4/1976 | Miyano et al. | 430/167 |
| 4,347,303 | 8/1982 | Asano et al. | 430/162 |
| 4,358,522 | 11/1982 | Fujita et al. | 430/303 |
| 4,496,647 | 1/1985 | Kawabe et al. | 430/166 |
| 4,690,886 | 9/1987 | Naritomi et al. | 430/166 |

FOREIGN PATENT DOCUMENTS

| | | | |
|---|---|---|---|
| 0154980 | 9/1985 | European Pat. Off. | 430/272 |
| 49-73202 | 7/1974 | Japan . | |
| 0229031 | 11/1985 | Japan | 430/272 |

*Primary Examiner*—Paul R. Michl
*Assistant Examiner*—Patrick A. Doody
*Attorney, Agent, or Firm*—Burns, Doane, Swecker & Mathis

[57] ABSTRACT

A dry photosensitive lithographic printing plate has a base, a photosensitive layer formed on the base and a silicone rubber layer formed on the photosensitive layer. The silicone rubber layer is formed from a silicon rubber composition containing an organopolysiloxane and a reactive aromatic aminosilane compound.

18 Claims, No Drawings

DRY PHOTOSENSITIVE LITHOGRAPHIC PLATE COMPRISING A SILICON RUBBER LAYER CONTAINING AN AROMATIC AMINOSILANE

BACKGROUND OF THE INVENTION (1) Field of the Invention

The present invention relates to a photosensitive plate used for the production of a lithographic plate to be used in the dry lithography, i.e. a lithographic printing plate requiring no dampening solution.

(2) Description of the Prior Art

Various dry lithographic printing plates have been known in which a photosensitive layer and a silicone rubber layer are formed in sequence on a base. Such lithographic printing plates are disclosed, for example, in Japanese Patent Publication Nos. 23042/1969, 26923/1979 and U.S. Pat. No. 3,511,178, as well as in Japanese Patent Application (OPI) (the term "OPI" as used herein means as unexamined published patent application) No. 22781/1980, U.S. Pat. No. 4,358,522, B.P. 2,034,911 and U.S. Pat. No. 4,342,820. Among them, dry lithographic plates comprising the photodimerizable photosensitive resin disclosed in Japanese Patent Publication No. 22781/1980 are less liable to be influenced by oxygen during plate making and exposure steps than the dry photosensitive lithographic plates having photopolymerizable sensitive layer of the type shown in Japanese Patent Publication No. 26923/1979. Therefore, satisfactory printing is possible even when the plates have no substantial oxygen-impermeable overcoating layer for example the plates having no projection pattern or the substantially oxygen permeable thin coating layer on the silicone rubber layer to improve the vacuum contact of original film to the plates, or even when the original film is directly placed on the silicone rubber layer so as to gain the improved tone reproduction.

Further, the dry photosensitive lithographic plates containing the photodimerizable sensitive resin are superior to the plates containing the photopolymerizable photosensitive composition in that the former is less liable to be influenced by the exposure temperature in the plate-making and exposing steps and in that the sensitivity of the former does not vary with the retention time from the exposure to the development steps or the temperature in these steps and, therefore, stable plate making is possible when the former plates are used.

However, special treatments were necessitated to prepare the former plates. These treatments include, for example, the formation of an adhesive intermediate layer between the ink-repelling silicone rubber layer and the photodimerizable photosensitive layer; the incorporation of a silane coupling agent having an aminoalkyl group in a silicone rubber composition used for forming the silicone-rubber layer; the introduction of a hydroxyl group or the like reactive with the silicone rubber layer in the photodimerizable photosensitive material to improve the adhesion of these layers each other; and the heat treatment effected in the course of the drying and curing of the silicone rubber composition.

Among these processes, the process wherein the adhesive intermediate layer is formed between the photosensitive layer and silicone rubber layer so as to improve the adhesion is not satisfactory, since the developability of the obtained dry lithographic plate is deteriorated and the number of steps is increased because of the formation of the adhesive intermediate layer in the preparation thereof, though stable adhesive force is obtained by this process and the product can be stored for a long period of time (1 to 2 years) without causing any trouble. The process wherein the silane coupling agent having an aminoalkyl group is incorporated in the silicone rubber composition has defects in that when the obtained lithographic plate is left to stand for a period of as long as six months the adhesion is deteriorated and sufficient image-reproduction becomes impossible and that when the processed plate is left to stand for several days, the silicone rubber layer (non-image-forming area) falls off easily during the printing and it becomes difficult to obtain a sharp image printing, though it has been said that this process is preferred because the developability is improved remarkably and the step of forming the intermediate layer can be omitted. The process wherein a functional group reactive with the silicone rubber layer is introduced in the photodimerizable photosensitive material per se has problems in that the material cannot be synthesized easily and that the intended photodimerizable photosensitive material having the desired properties cannot be obtained easily.

Also proposed is a negative dry photosensitive lithographic printing plate of the type in which, as disclosed in Japanese Patent Application OPI Nos. 55-59466/1980 and 110249/1980, a photosensitive layer containing orthoquinone diazido compound is applied to an aluminum base and then a silicone rubber layer is formed on the photosensitive layer. According to Japanese Patent Application OPI No. 110249/1980, it is possible to obtain a negative dry photosensitive lithographic printing plate is obtained when the silicone rubber composition contains aminosilane expressed by the following formula.

$$R_m R'_n Si(O R'')_{4-m-n}$$

where, R represents an alkyl group containing a non-substituted or mono-substituted amino group, R' and R'' represent an alkyl group or an allyl group, m represents 1 or 2, and n represents 0 or 1, wherein the condition of m+n=1 or m+n=2 is met.

However, the addition of the aminosilane to the silicone rubber causes a problem in that the curing speed is significantly decreased so that the silicone rubber exhibits, when left for a long time, reduces the bonding power with the result that the bonding power is significantly reduced so as to deteriorate the image reproducibility undesirably.

SUMMARY OF THE INVENTION

Accordingly, an object of the present invention is to provide a dry type photosensitive lithographic printing plate having a laminated construction composed of a base, a photosensitive layer formed on the base and a silicone rubber layer formed on the photosensitive layer, wherein the interlaminar adhesion between the photosensitive layer and the silicone rubber layer is increased without necessitating any bonding layer therebetween while avoiding any reduction in the bonding power between these layers even after a long time, whereby a printing plate having satisfactory performance can be obtained even after a long time and problems such as coming off of the silicone rubber forming the non-image-forming area is inhibited even after the plate is left for a long time after the plate making.

This and other objects of the present invention will be clear from the following description.

The inventors have found that when a silicone rubber composition comprising as essential components an orgnaopolysiloxane and reactive aromatic silane compound is used for forming the silicone rubber layer to be placed on the photosensitive layer, the interlaminar adhesion between the photosensitive layer and the silicone rubber layer can be improved and the interlaminar adhesion is not deteriorated for a long period of time.

Thus, the present invention provides an excellent dry photosensitive lithographic plate comprising a laminate of a photodimerizable photosensitive layer and a silicone rubber layer adjacent to the photosensitive layer, wherein the silicone rubber layer is formed from a silicone rubber composition which contains both organopolysiloxane and aromatic aminosilane compound.

DESCRIPTION OF THE PREFERRED EMBODIMENTS

The dry photosensitive lithographic printing plate in accordance with the present invention should have a flexibility of such an extent that enables the plate to be set on ordinary plate printing press, as well as strength of a level high enough to withstand any load which may be imposed during printing.

Typically, base is made of materials such as a coated paper, a metallic plate, a plastic film such as polyethylene terephthalate, rubber or a composite base made of a combination of some of these materials, These bases materials may further be coated with a primer layer or the like for the purpose of, for example, preventing halation. Preferably, the primer layer may be formed from an epoxy resin to have a thickness generally ranging between 4 and 10μ on the base surface.

The photosensitive layer according to the present invention may be made of any of materials comprising a photo polymerizable resin or photocrosslinking resin so far as its solubility or wettability before the exposure is different from that after the exposure.

The compound and the composition constituting the photoconductive layer may include the following substances:

(1) A photopolymerizable composition containing: an unsaturated monomer having a boiling temperature above 100° C. and non-volatile at room temperature or an oligomer, a photosensitizer, a heat-polymerization inhibitor and, if necessary, a filler for maintaining the shape at room temperature and some additvves.

Examples of the unsaturated monomers are: acrylate esters and methacrylate esters such as ethylene glycol di(metha)acrylate, polyethylene glycol di(metha)acrylate, hydroxyethyl (metha)acrylate, hydroxypropyl(metha)acrylate, glycidyl (metha)acrylate, 1-chloro-2-hydroxyethyl (metha) acrylate; acrylamide derivatives such as ethylene bisacrylamide, N-methylol acrylamide, and methoxymethyl acrylamide; esters of allylalcohol such as triallylcyanurate, triallylphosphate, diallylphthalate, diallylmaleate; and other stylene derivatives.

Examples of the photosensitizer are benzophenon derivatives; benzoin derivatives; anthraquinone derivatives; aldehydes, ketone, sulfur compounds; halides; and dyestuffs such as methylene blue riboflavin.

Examples of heat-polymerization inhibitor are hydroquinone derivatives; phenol derivatives; nitrosubstituted benzene; tertiary amines and phenothiazine derivatives.

Examples of materials usable as the filler or the additives are: fine powders of inorganic matters such as colloidal silica, calcium carbonate, magnesium carbonate, iron oxides; polyvinyl acetate; poly(metha)acrylate esters; polyethylenes having molecular weights of several of thousands; polypropylene; polyvinylchloride; vinyl polymers such as polyvinylidene chloride; and resin systems before curing such as resol phenol resins, uric resin, melamine resins, epoxy resins and unsaturated polyester resin.

(2) Photo-crosslinkable resin compositions containing polyesters, polycarbonates, polyamides, polyacrylic esters, polyvinyl alcohol derivatives and epoxy resin derivatives having the following groups in the main chain or side chain of the polymer, with or without addition of a photosensitizer:

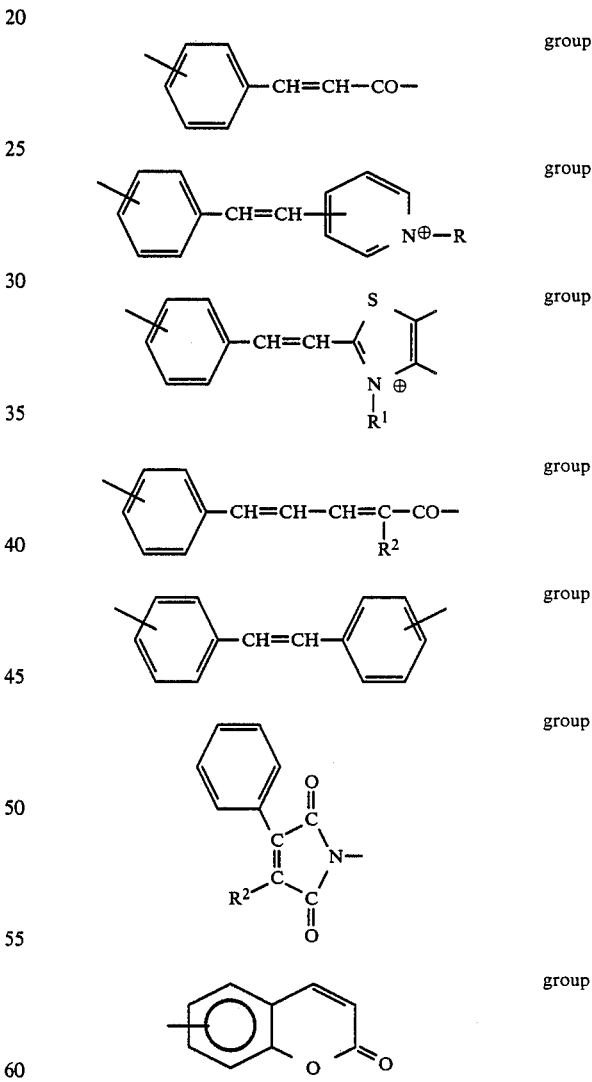

wherein R and $R^1$ represent each an alkyl group having 1 to 10 carbon atoms and $R^2$ represents a hydrogen or halogen atom, an alky group having 1 to 10 carbon atoms or cyano group.

Though the molecular weight of the above-mentioned resins is not limited so far as they are soluble in a solvent, it is selected advantageously in the range of 1000 to several tens of thousands. Particularly preferred polymers are, for example, photosensitive polymers having a photosensitive group in the main chain such as a photosensitive polyester of p-phenylenediacrylic acid and a diol such as those disclosed in the specifications of U.S. Pat. Nos. 3,030,208 and 3,707,373; photosensitive polymers such as photosensitive polyesters derived from a 2-propelidenemalonic acid compound such as cynnamylidene-malonic acid and a difunctional glycol as disclosed in the specifications of U.S. Pat. Nos. 2,956,878 and 3,173,787; and photosensitive polymers which can be insolubilized by active rays such as cinnamic acid esters of hydroxyl group having polymers such as polyvinyl alcohol, starch, cellulose and analogous of these as disclosed in the specifications of U.S. Pat. Nos. 2,690,966; 2,752,372 and 2,732,301.

Examples of the photosensitizers contained in the photosensitive resin layer according to the present invention include those disclosed in the specifications of U.S. Pat. Nos. 2,610,120, 2,670,285, 2,670,286, 2,670,287, 2,690,966, 2,732,301, 2,835,656, 2,956,878, 3,023,100, 3,066,117, 3,141,770, 3,173,787, 3,357,831, 3,409,593, 3,418,295, 3,453,110, 3,475,617, 3,561,969, 3,575,922, 3,582,327, 3,647,470, 3,721,566 and 3,737,319. Examples of particularly useful sensitizers include 2-benzoylmethylene-1-methyl-$\beta$-naphthothiazoline, 5-nitroacenaphthene, -chloranthraquinone, 1,2-benzalanthraquinone, p,p'-tetraethyldiaminodiphenyl ketone, p,p'-dimethyl aminobenzophenone and 4-nitro-2-chloroaniline. The amount of the sensitizer is preferably in the range of 0.5 to 15% (by weight; the same hereinafter), particularly 2 to 8% based on the polymer. (3) A composition containing a photohardenable diazo resin or a photohardenable azido resin and as desired, a photosensitizer and a small amount of filler additive.

Examples of the photohardenable diazo resin are zinc chloride double salts of condensates of formaldehyde and diazoamines such as paradiazo diphenylamine, paradiazo monoethylaniline, paradiazo benzylethylaniline, and so forth.

Examples of the photohardenable azido resin are azidophthalic acid ester of polyvinylalcohol, azidobenzoic acid ester of polyvinyl alcohol, and ester of stylenemaleic anhydride copolymer and aromatic azido alcohol such as $\beta$-(4-azidophenol)ethanol.

Photosensitizers, fillers and additives mentioned in (1) and (2) above can be used also in this case. (4) Composition containing 0-quinone diazide compound.

O-quinone diazide compounds most suitably used are O-naphthoquinone diazide compounds disclosed in many literatures such as the specifications of U.S. Pat. Nos. 2,766,118; 2,767,092; 2,772,972; 2,859,112; 2,907,665; 3,046,110; 3,046,111; 3,046,115; 3,046,118; 3,046,119; 3,046,120; 3,046,121; 3,046,122; 3,046,123; 3,061,430; 3,102,809; 3,106,465; 3,635,709 and 3,647,443.

Among these O-quinone diazide compounds, preferably used are: O-naphthoquinone diazide sulfonate ester or O-naphthoquinone diazidecarboxylic acid ester of aromatic hydroxy compound; and O-naphthoquinone diazide sulfonate amide or O-naphthoquinone diazidecarboxylic acid amide of aromatic amide compound. Examples of these materials are: esters or benzoquinone-1,2-diazidesulfonate or naphthoquinone-1,2-diazidesulfonate and polyhydroxyphenyl (including partial ester: the same applies hereinafter); ester of naphthoquinone-1,2-diazode-4-sulfonate or naphthoquinone-1,2-diazide-5-sulfonate and pyrogallol acetone resin; ester of benzoquinone1,2-diazidesulfonate or naphthoquinone-1,2-diazidesulfonate and phenolformaldehyde novolak resin or cresolformaldehyde novolak resin; amide of poly(p-aminostyrene) and naphthoquinone-1,2-diazide-4-sulfonate or naphthoquinone-1,2-diazide-5-sulfonate; ester of polyethyleneglycol and naphthoquinone-1,2-diazide-4-sulfonate or naphthoquinone-1,2-diazide-5-sulfonate; amide of polymeric amine and naphthoquinone-1,2-diazide-4-sulfonate or naphthoquinone-1,2-diazide-5-sulfonate; ester of polymethacrylate p-hydroxyanilide and naphthoquinone-1,2-diazide-4-sulfonate or naphthoquinone-1,2-diazide-5-sulfonate; amide of aminedenatured natural resin rosin and naphthoquinone-1,2-diazide5-sulfonate; ester of an epoxy resin from bisphenol A and propyleneoxide and naphthoquinone-1,2-diazide-5-sulfonate; ester of polymer of monoester of (metha)acrylate and dihydroxyphenyl and naphthoquinone-1,2-diazide-4-sulfonate or naphthoquinone-1,2-diazide-5-sulfonate; polymer of condensate of aminoisophthalate diallyl ester and naphthoquinone-1,2-diazide sulfonate; ester of polycarbonate and quinone diazidesulfonate; quinonediazides crosslinked with isocyanate or the like; ester of bisphenol A and naphthoquinone-1,2-diazide-4-sulfonate or naphthoquinone-1,2-diazide-5-sulfonate; esters of naphthoquinone-1,2-diazide-5-sulfonate and phenols such as phenol, p-cresol or the like or alcohols such as ethylalcohol, propylalcohol, buthylalcohol and amylalcohol; and acid amides of naphthoquinone-1,2-diazide-5-sulfonate and amines such as aniline, p-hydroxyaniline and so forth. Among these materials, most suitably used is O-quinoneazide photosensitive resins. It is possible to add, to the above-mentioned compositions containing O-quinone azide compounds, compounds which causes diazo coupling under basic condition. Such compounds are disclosed in U.S. Pat. No. 4,642,283.

Among the photosensitive materials mentioned above, most suitably used are the materials mentioned in (1), (2) and (4). These materials may be supplied as necessitated with an additive or additives such as dye-stuffs, pigments, plasticizers and anti-oxidation agents.

Preferably, the photosensitive layer has a thickness ranging between 0.1 and 10$\mu$. In the case where the photosensitive layer is of the type which is removed by dissolving, the thickness of the photosensitive layer is made as small as possible from the view point of tone reproducibility. In this case, therefore, the thickness preferably ranges between 0.1 and 0.5$\mu$.

The silicone rubber layer according to the present invention is made of mainly a linear organopolysiloxane comprising the following recurring units and having a molecular weight of several thousands to several hundreds of thousands:

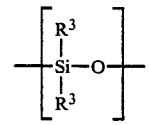

wherein $R^3$ represents an alkyl group having 1 to 10 carbon atoms or phenyl group and preferably at least 60% of $R^3$ represents methyl group.

The linear organopolysiloxane as mentioned above is used usually in the form of a crosslinked silicone rubber prepared by adding a reactive crosslinking agent thereto. The crosslinking agents used for crosslinking so-called room temperature (low temperature) vulcanizing silicone rubbers include, for example, silanes which may have a monovalent organic group bonded with the silicon atom, such as acetoxysilanes, ketoxime silanes, aminoxysilanes, amidosilanes, alkoxysilanes and hydroxysilanes; the siloxanes which are the condensates of above silanes having a low degree of polymerization; and organohydrogen-polysiloxanes. These crosslinking agents react with the terminal hydroxyl group of the linear organopolysiloxane to form a crosslinked silicone rubber and also to improve the adhesion thereof with the photosensitive layer. The crosslinking agent is contained in an amount of 0.1 to 10% based on the solid matter in the silicone rubber composition.

The present invention is characterized in that a part or the whole amount of the above-mentioned ordinary crosslinking agent is substituted by a reactive aromatic aminosilane compound, i.e., a reactive aminosilane compound having an aromatic nucleus in its molecule or its partially hydrolyzed product to improve the adhesion between the photosensitive layer and the silicone rubber layer and to maintain the interfacial adhesion during the storage over a long period of time. Though the mechanism has not fully been elucidated yet, it is assumed that the excellent effects of the present invention are obtained since the aromatic nucleus in the reactive aminosilane compound causes a specific mutual interaction with the aromatic nucleus in the photosensitive resin so as to allow selective concentration of the reactive aminosilane compound containing the aromatic nucleus to the interface.

Examples of the reactive aromatic aminosilane compounds used in the present invention include compounds of the following general formula:

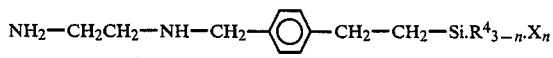

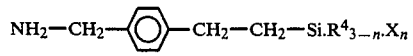

wherein n represents a number from 1 to 3, $R^4$ represents an alkyl group or a phenyl group having molecular number of 1 to 3, and X represents a hydrolyzable group such as the following functional group:

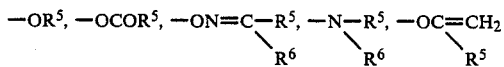

where $R^5$ and $R^6$ represent alkyl group or substituted alkyl groups having molecular number of 1 to 3.

Though the above-mentioned compounds are preferred as the reactive silane compounds, other compounds may also be used. The amount of the reactive silane compound is 0.5 to 10%, preferably 1 to 5%, by weight based on the total weight of the linear organopolysiloxane. When the amount exceeds the above-mentioned range, the curing speed of the silicone rubber is decreased to make it difficult to obtain sufficient strength of the layer after the curing. In addition, the strength of the silicone rubber tends to be deteriorated when left for a long time at high temperature, with the result that the strength of the silicone rubber is reduced to allow the portion of the silicone rubber layer which constitutes non-image-forming area after development to come off undesirably. On the other hand, a too small amount of addition of the reactive silane compound makes it difficult to obtain sufficient adhesion.

The silicone rubber composition may contain further a small amount of a metal (such as tin, zinc or lead) salt of an organocarboxylic acid as a catalyst. In addition, 0 to 300% of a reinforcing filler such as fumed silica may be added to the silicone rubber composition. Further, a photosensitizer similar or analogous to what can be added to the photosensitive layer may also be added to the silicone rubber composition.

The thickness of the silicone rubber layer formed from the above-mentioned silicone rubber composition is about 0.5 to 10μ. Though the silicone rubber layer is preferably as thin as possible from the viewpoint of the tone reproduction, a given thickness is necessary from the viewpoint of printing durability or protection from print staining. Thus, a thickness of 1.0 to 3.0μ is usually preferred.

A thin protective film or sheet of polyethylene terephthalate, polyethylene, polypropylene, polystyrene, polyvinyl chloride, polyvinylidene chloride or cellophane which may have projection pattern on the surface or not, may be placed on the surface of the above-mentioned dry photosensitive lithographic plate having the top silicone rubber layer so as to protect said surface. This protective film is removed prior to the exposure. On the contrary, a protective film having a transparency sufficient for the permeation of U.V. rays and a thickness less than 30μ so as to prevent the diffusion of light in the exposing step can be subjected to the exposure without removing the same. Further, the silicone rubber layer can be coated with a water-soluble protective layer by a process disclosed in Japanese Patent Laid-Open Nos. 27545/1986 and 27546/1986.

After the exposure through an original film, the dry photosensitive lithographic plate of the present invention is treated with a developer so as to remove the photosensitive layer portion in the image-forming area, as well as the silicone rubber layer thereon. Alternatively, the development is effected by a developer capable of selectively swelling only the portion of the silicone rubber layer on the image-forming area, thus allowing only the silicone rubber layer on the image-forming area to be removed. By either of these processes, the intended dry lithographic plate can be obtained.

Conventional developers for the dry photosensitive lithographic plates may be used as the developers according to the present invention. Preferred examples of them include aliphatic hydrocarbons (such as hexane, heptane and Isopar E, H or G (trade name of aliphatic hydrocarbons of Esso Standard Co.), gasoline and kerosene), aromatic hydrocarbons (such as toluene and xylene) and halogenated hydrocarbons (such as trichloroethylene) in the form of a mixture with the following polar solvents:

alcohols (such as methanol and ethanol)
ethers (such as methylcellosolve, ethylcellosolve, butylcellosolve, methylcarbitol, ethylcarbitol, butylcarbitol and dioxane),
ketones (such as acetone and methyl ethyl ketone), and,
esters (such as ethyl acetate, methylcellosolve acetate, cellosolve acetate and carbitol acetate).

The developers comprising the above-mentioned organic solvent may be used in the form of a mixture with water or they may be solubilized in water with surface active agents.

Further, dyes such as Crystal Violet and Astrazone Red may be added to the developer so as to color the image at the time of the development.

The development can be effected by, for example, rubbing the plate with a developing pad containing said developer or by pouring the developer on the plate surface and rubbing the same with a developing brush according to a known process. By this treatment, both of the silicone rubber layer and the photosensitive layer in the image-forming area are removed to expose the surface of the base or the primer layer which serves as an ink-receiving area or, alternatively, only the silicone rubber layer in the image-forming area is removed to expose the photosensitive layer which serves as the ink-receiving area.

The dry photosensitive lithographic plate of the present invention shows a remarkably improved developability though no adhesive intermediate layer is provided between the photosensitive layer and the silicone rubber layer. Further, said plate of the present invention has far superior storage stability to that of an ordinary plate prepared by incorporating a silane coupling agent having an aminoalkyl group but free of an aromatic nucleus in the silicone rubber composition.

The present invention will be further illustrated by the following non-limitative examples.

EXAMPLE 1

The following primer layer-forming composition was applied in an amount of 0.5 g/m² (dry basis) to a smooth aluminum plate which had been degreased by an ordinary process and then the obtained product was dried.

| Primer layer-forming composition: | |
| --- | --- |
| Photosensitive unsaturated polyester obtained by polycondensing p-phenylene diacrylic diethylester with 1,4-dihydroxyethyloxycyclohexane (1/1 molar ratio) | 10.0 parts by weight |
| 1-Methyl-2-benzoylmethylene-naphthothiazoline | 0.6 part by weight |
| Methylcellosolve acetate | 300 parts by weight |
| Toluene | 150 parts by weight |

Then, the aluminum plate coated with the above-mentioned composition was exposed to a light (30 count) with an Ft 26 V UNDS Ultra-plus flip-top plate maker (a product of NUARC Co.). The following photosensitive composition was applied in an amount of 0.25 g/m² (dry basis) to the primer layer and then dried:

| Photosensitive composition: | |
| --- | --- |
| Photosensitive unsaturated polyester obtained by polycondensing p-phenylene diacrylic diethylester with 1,4-dihydroxyethyloxycyclohexane (1/1 molar ratio) | 10 parts by weight |
| 1-Methyl-2-benzoylmethylene-$\beta$-naphthothiazoline | 0.6 parts by weight |
| Sumitone Cyanine Blue VH 514 (Phthalocyanine Blue pigment of Sumitomo Chemical Co., Ltd.) | 2 parts by weight |
| Methylcellosolve acetate | 600 parts by weight |
| Toluene | 300 parts by weight |

Then, the following silicone rubber composition was applied in an amount of 2.0 g/m² (dry basis) to the photosensitive layer and then dried to form a cured silicone rubber layer:

| Silicone rubber composition: | |
| --- | --- |
| Dimethylpolysiloxane terminated by hydroxyl groups (molecular weight: about 600,000) | 100 parts by weight |
| Methylhydrogenpolysiloxane terminated by trimethylsilyl groups (molecular weight: about 2,500) | 3.5 parts by weight |
| N—($\beta$-aminoethyl)aminomethyl-phenetyl trimethoxysilane | 1.7 parts by weight |
| Dibutyltin dioctanoate | 2.0 parts by weight |
| Isopar G (a product of Esso Standard Co.) | 2000 parts by weight |

A polypropylene film having a thickness of 12$\mu$ and a mat-finished surface was applied to the surface of the thus obtained silicone rubber layer to form a laminate, i.e. a dry photosensitive lithographic plate.

A positive film was placed by vacuum on the plate prepared as above and exposed for 30 counts with the above-mentioned plate maker of NUARC Co. After the top film was peeled off, the plate was then immersed in a developer comprising 90 parts by weight of Isopar H (a product of Esso Standard Co.), 7 parts by weight of diethylene glycol monobutyl ether, 3 parts by weight of diethylene glycol monoethyl ether and 5 parts by weight of diethyl succinate for one minute and thereafter rubbed lightly with a developing pad to remove the photosensitive layer and silicone rubber layer in unexposed areas.

Thus, the dry lithographic plate on which the image of the positive film had been reproduced faithfully all over the surface could be obtained. This plate was mounted on a Heidelberg GTO offset printing press from which the waterfeeding device had been removed. Printing was carried out using Toyo King Ultra TKU aqualess G ink (a product of Toyo Ink Co., Ltd.), and a sharp image printing free of scumming was obtained.

On the other hand, when the dry photosensitive lithographic plate having the polypropylene film layer was left to stand in a dark place for 6 months and then subjected to the exposure, development and press treatments in the same manner as above, a sharp image printing free of scumming similar to that obtained immediately after the preparation of the plate was obtained.

COMPARATIVE EXAMPLE 1

A comparative sample of dry photosensitive lithographic plate was prepared in the same manner as in Example 1 except that N-$\beta$-aminoethyl) aminomethyl-phenethyl trimethoxysilane in the silicone rubber composition was replaced with N-($\beta$aminoethyl)-$\gamma$-aminopropyl trimethoxysilane. The plate was processed and the printing was effected in the same manner as in Example 1 to obtain a sharp image printing free of scumming.

However, when the comparative sample of the dry photo sensitive lithographic plate was left to stand in a dark plate for 6 months and then subjected to the exposure and development in the same manner as above, the silicone rubber layer in non-image-forming part fell off and, therefore, a plate usable for the printing could not be obtained.

EXAMPLE 2 AND COMPARATIVE EXAMPLE 2

The same primer layer and photosensitive layer as in Example 1 were formed on the same, degreased smooth aluminum base as in Example 1 in the same manner as above. Then, the following silicone rubber composition was applied in an amount of 2.0 g/m (dry basis) to the photosensitive layer and then dried and cured:

| | |
|---|---|
| Dimethylpolysiloxane terminated by hydroxyl groups (molecular weight: about 600,000) | 100 parts by weight |
| Methylhydrogenpolysiloxane terminated by trimethylsilyl groups (molecular weight: about 2,500) | 3.5 parts by weight |
| N—(β-aminoethyl) aminomethylphenetyl trimethoxysilane | 0.7 parts by weight |
| Dibutyltin dioctanoate | 1.7 parts by weight |
| Isopar G (a product of Esso Standard Co.) | 2000 parts by weight |

A polypropylene film having a thickness of 12μ and a mat-finished surface was applied to the surface of the thus obtained silicone rubber layer to form a laminate, i.e. a dry photosensitive lithographic plate.

This plate had a high storage stability similar to that obtained in Example 1.

When the lithographic plate was processed in the same manner as in Example 1, left to stand for 50 days and used for the printing in the same manner as in Example 1, a sharp image printing free of scumming was obtained.

On the other hand, when a dry photosensitive lithographic plate prepared in the same manner as in Example 2 except that N-(β-aminoethyl) aminomethylphenetyl trimethoxysilane (0.7 weight parts) in the silicone rubber composition was replaced with N-β-aminoethyl)-γ-aminopropyl trimethoxysilane (0.7 weight parts) was processed in the same manner as in Example 1 and left to stand, the silicone rubber layer in non-image-forming areas fell off after about 30 days and no sharp image printing could be obtained.

EXAMPLE 3 AND COMPARATIVE EXAMPLE 3

An aluminum sheet or plate of 0.24 mm thick was treated for 2 seconds at 60° C. with 20% aqueous solution of sodium tertiary phosphate so as to be degreased, followed by rinsing with water. The aluminum sheet was then treated with 3% aqueous solution of JIS No. 3 sodium silicate at 70° C., so as to become a base. A material of the primer layer was prepared by dissolving, in 500 weight parts of methanol, 1 weight part of TORAY SILICONE PRIMER SH6020 (N-β(aminoethyl)- γ-aminopropyl trimethoxysilane). The material thus prepared was applied to the base and was dried at 100° C. for 1 minute. Then, a photosensitive solution having the following composition was applied to the aluminum base with the primer layer in amount of 1.0 g/m² in dry basis and was then dried.

| Composition of photosensitive solution: | |
|---|---|
| 2-diazo-1-naphthol-5-sulfonate ester of polyhydroxyphenyl obtained through condensation polymerization of acetone and pyrogallol (Disclosed in the specification of U.S. Pat. No. 3,635,709) | 8.5 weight parts |
| Polymeric compound (mean molecular weight about 10,000) having a composition expressed by the following formula. | 1.5 weight parts |
| methylcellosolve acetate | 120 weight parts |
| methylethylketone | 60 weight parts |

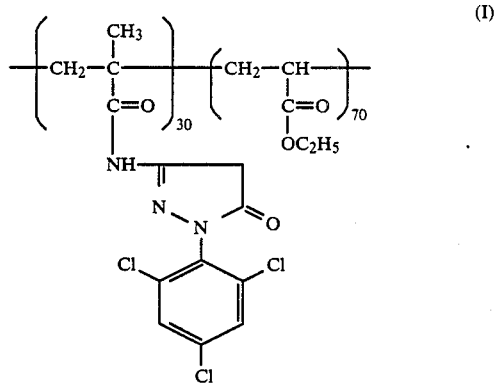

A silicone rubber composition having the following composition was applied on the photosensitive layer and was heated for curing for 2 minutes at 120° C. The thus obtained silicone rubber layer weighed 2 g/m² on dry basis. Though the product sheets were left with cardboards placed therebetween, no adhesion to the cardboard was observed. The product will be referred to as "Plate A" hereinafter. Silicone rubber composition:

| | |
|---|---|
| Dimethylpolysiloxane terminated by hydroxyl groups (molecular weight: about 70,000) | 90 parts by weight |
| Methylhydrogenpolysiloxane terminated by trimethylsilyl groups (molecular weight: about 2,500) | 3 parts by weight |
| N—(β-aminoethyl)aminomethylphenetyl trimethoxysilane | 1.5 parts by weight |
| Dibutyltin dioctanoate | 3 parts by weight |
| Isopar G (a product of Esso Standard Co.) | 1900 parts by weight |

On the other hand, a comparison example was prepared by using a silicone rubber composition which was substantially the same as that mentioned above except that N-(β-aminoethyl)aminomethylphenetyl trimethoxysilane was replaced with N-β-aminoethyl)aminopropyl trimethoxysilane. The silicone rubber composition after the application was heated for 2 minutes at 120° C. for curing but the silicone rubber composition was not completely cured. Thus, the products were undesirably adhered to cardboards between which they were placed. Therefore, the product incorporating N-(β-aminoethyl)aminopropyl trimethoxysilane was placed, following the curing at 120° C. for 2 minutes, in a dark place whole through a night so as to be completely cured. The plate thus obtained will be referred to as "plate B" hereinunder.

The plates A and B thus obtained were subjected to an exposure for 600 counts by an EYE ROTARY PRINTER of EYE Graphics Co.) with negative films placed in close contact therewith. The exposed plates were then subjected to development which was conducted by means of a developing pad impregnated with a developer which was prepared from 75 weight parts of ethylalcohol and 25 weight parts of Isopar G. The printing plate obtained from the plate A showed excellent gradation of image even in the shadow portion, whereas the printing plate formed from the plate B showed a disturbance in the shadow portion of the image.

EXAMPLE 4

An aluminum base coated with the same primer as Example 3 was prepared, and a photosensitive solution having the following composition was applied in amount of 1.0 g/m² on dry basis.

| Composition of developing solution: | |
|---|---|
| 2-diazo-1-naphthol-5-sulfonate ester of polyhydroxyphenyl obtained through condensation polymerization of acetone and pyrogallol (Disclosed in the specification of U.S. Pat. No. 3,635,709) | 10 weight parts |
| methylcellosolve acetate | 120 weight parts |
| methylethylketone | 60 weight parts |

A silicone rubber composition of the same type as that used in Example 3 was applied to the photosensitive layer by means of a whirler. The thus obtained silicone rubber layer weighed 2 g/m² on dry basis and was completely cured. Exposure and development were conducted by the same method as in Example 3, using a negative film held in close contact therewith. The thus obtained printing plate was used in printing with an ink applied thereto with an ink roller, and the printed image showed superior gradation even in the shadow portion.

What is claimed is:

1. A dry photosensitive lithographic printing plate having a base, a photosensitive layer on said base and a silicone rubber layer on said photosensitive layer on said base and a silicone rubber layer on said photosensitive layer, wherein the silicone rubber layer is formed from a silicone rubber composition containing an organo-polysiloxane and a reactive aromatic aminosilane compound of the forumla:

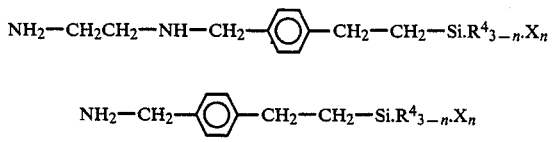

wherein n represents a number from 1 to 3, $R^4$ represents an alkyl group or phenyl group having molecular number of 1 to 3, and X represents a hydrolyzable group.

2. A dry photosensitive lithographic printing plate as set forth in claim 1, wherein the organo-polysiloxane has the following recurring units and a molecular weight of several thousands to several hundreds of thousands:

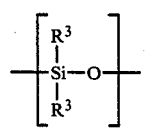

wherein $R^3$ represents an alkyl group having 1 to 10 carbon atoms or phenyl group.

3. A dry photosensitive lithographic printing plate as set forth in claim 2, wherein at least 60% of $R^3$ is methyl group.

4. A dry photosensitive lithographic printing plate as set forth in claim 2, wherein the reactive aromatic aminosilane compound is used as a part or whole amount of a crosslinking agent.

5. A dry photosensitive lithographic printing plate as set forth in claim 2, wherein the reactive aromatic aminosilane compound has an aromatic nucleus in its molecule or its partial hydrolyzate.

6. A dry photosensitive lithographic printing plate as set forth in claim 7, wherein the hydrolyzable group is selected from the following functional groups:

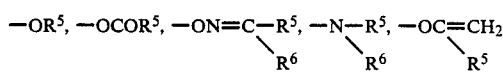

where $R^5$ and $R^6$ represent alkyl group or substituted alkyl groups having molecular number of 1 to 3.

7. A dry photosensitive lithographic printing plate as set forth in claim 2, wherein the amount of the reactive aromatic aminosilane compound is 0.5 to 10% based on the organo-polysiloxane.

8. A dry photosensitive lithographic printing plate as set forth in claim 2, wherein the thickness of the silicone rubber layer formed from the silicone rubber layer is about 0.5 to 10μ.

9. A dry photosensitive lithographic printing plate as set forth in claim 1, wherein the photosensitive layer contains at least one compound of which the main chain or a side chain has one of the following groups:

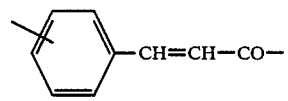

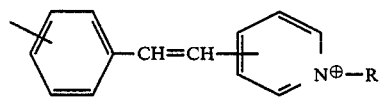

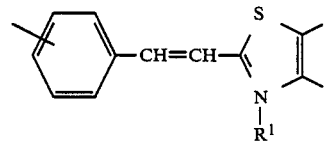

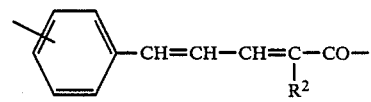

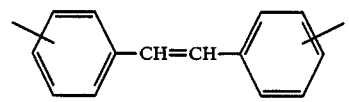

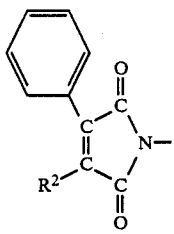

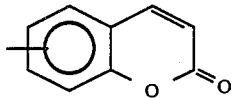

wherein R and R¹ represent each an alkyl group having 1 to 10 carbon atoms and R² represents a hydrogen or halogen atom, an alkyl group having 1 to 10 carbon atoms or cyano group.

10. A dry photosensitive lithographic printing plate as set forth in claim 1, wherein the photosensitive layer contains an O-quinone diazide compound.

11. A dry photosensitive lithographic printing plate as set forth in claim 10, wherein the photosensitive layer further contains at least one sensitizer in amount of 2 to 8% by weight relative to the compound.

12. A dry photosensitive lithographic printing plate as set forth in claim 11, wherein the sensitizer is selected from the group consisting of 2-benzoylmethylene-1-methyl-β-naphthothiazoline, 5-nitroacenaphthene, β-chloroanthraquinone, 1,2-benzal-anthraquinone, p,p'-tetraethyldiaminodiphenyl ketone, p,p'-dimethylaminobenzophenone and 4-nitro-2-chloroaniline.

13. A dry photosensitive lithographic printing plate as set forth in claim 1, wherein the thickness of the photosensitive layer is between 0.1 to 10μ.

14. A dry photosensitive lithographic plate as set forth in claim 1, wherein the photosensitive layer is coated on a base.

15. A dry photosensitive lithographic printing plate as set forth in claim 14, wherein the base is a coated paper, a metal plate, a plastic film or a rubber plate.

16. A dry photosensitive lithographic printing plate as set forth in claim 14, wherein the base is coated with a primer layer.

17. A dry photosensitive lithographic printing plate as set forth in claim 1, wherein the silicone rubber layer is covered with a protective layer.

18. A dry photosensitive lithographic printing plate as set forth in claim 17, wherein the protective layer is a thin film or sheet of polyethylene terphthalate, polyethylene, polypropylene, polystyrene, polyvinyl chloride, polyvinylidene chloride or cellophane.

* * * * *

UNITED STATES PATENT AND TRADEMARK OFFICE
CERTIFICATE OF CORRECTION

PATENT NO. : 4,826,752

DATED : May 2, 1989

INVENTOR(S) : Susumu YOSHIDA et al

It is certified that error appears in the above-identified patent and that said Letters Patent is hereby corrected as shown below:

In Section [73], Assignee: Kindly add --SHIN-ETSU CHEMICAL CO., LTD., Tokyo, Japan--.

Signed and Sealed this

Thirtieth Day of January, 1990

*Attest:*

JEFFREY M. SAMUELS

*Attesting Officer*     *Acting Commissioner of Patents and Trademarks*